(12) United States Patent
Ha

(10) Patent No.: US 7,688,657 B2
(45) Date of Patent: Mar. 30, 2010

(54) APPARATUS AND METHOD FOR GENERATING TEST SIGNALS AFTER A TEST MODE IS COMPLETED

(75) Inventor: Sung-Joo Ha, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 282 days.

(21) Appl. No.: 11/819,421

(22) Filed: Jun. 27, 2007

(65) Prior Publication Data

US 2008/0048671 A1 Feb. 28, 2008

(30) Foreign Application Priority Data

Jul. 18, 2006 (KR) .................. 10-2006-0066695

(51) Int. Cl.
*G11C 29/00* (2006.01)
*G11C 7/00* (2006.01)
(52) U.S. Cl. .............. 365/201; 365/96; 365/225.7; 702/117; 702/118; 702/120; 714/718; 714/734
(58) Field of Classification Search .......... 365/96, 365/201, 225.7; 714/734, 718; 702/117, 702/118, 120
See application file for complete search history.

(56) References Cited

U.S. PATENT DOCUMENTS

| 5,263,031 A | 11/1993 | Inoue |
| 5,687,180 A | 11/1997 | Kawasaki |
| 5,901,105 A | 5/1999 | Ong et al. |
| 5,982,685 A * | 11/1999 | Kim ........................... 365/201 |
| 6,940,765 B2 | 9/2005 | Kyung |
| 6,940,776 B2 * | 9/2005 | Cho ........................ 365/225.7 |
| 2004/0228191 A1 * | 11/2004 | Do ............................. 365/202 |

FOREIGN PATENT DOCUMENTS

| JP | 9106698 | 4/1997 |
| JP | 2005071582 | 3/2005 |
| KR | 1020030025325 | 3/2003 |
| KR | 102040093823 | 11/2004 |
| KR | 1020050052850 | 6/2005 |
| KR | 1020050059918 | 6/2005 |

\* cited by examiner

*Primary Examiner*—VanThu Nguyen
(74) *Attorney, Agent, or Firm*—Venable LLP; Jeffri A. Kaminski

(57) ABSTRACT

A test signal generating apparatus for a semiconductor integrated circuit includes a fuse control unit that generates a plurality of fuse enable signals in response to a clock and a power-up signal, and a plurality of test mode fuses that individually output test mode fuse signals so as to generate test signals in response to the fuse enable signals after a test mode is completed.

20 Claims, 3 Drawing Sheets

APPARATUS AND METHOD FOR GENERATING TEST SIGNALS AFTER A TEST MODE IS COMPLETED

CROSS-REFERENCE TO RELATED PATENT APPLICATION

This application claims the benefit of Korean Patent Application No. 10-2006-0066695, filed on Jul. 18, 2006, in the Korean Intellectual Property Office, the disclosure of which is incorporated herein in its entirety by reference.

BACKGROUND OF THE INVENTION

1. Technical Field

The present invention relates to a test signal generating apparatus in a semiconductor integrated circuit and method for generating the test signal, and in particular, to a test signal generating apparatus in a semiconductor integrated circuit and method for generating the test signal having an increased area margin.

2. Related Art

Generally, in order to produce a semiconductor integrated circuit, a test should be performed for measuring a difference between a simulation result upon design and an operation of a real product. At present, various kinds of tests are performed so as to reduce an error rate of the semiconductor integrated circuit. The tests are performed on the basis of external commands and addresses. Accordingly, the semiconductor integrated circuit needs a test signal generating apparatus that generates a plurality of test signals from the commands and the addresses. The test signals generated by the test signal generating apparatus are used to change the operation in a prescribed area. At this time, some of the test signals should be continuously generated after the test is completed. Accordingly, in order to continuously generate the test signals, the general test signal generating apparatus includes test fuse circuit units corresponding to the number of test signals to be generated.

The fuse circuit unit provided in the general semiconductor integrated circuit is controlled by, for example, a laser or the like. However, the use of the fuse circuit unit that is artificially controlled by the laser makes it difficult to reduce the area of the test signal generating apparatus.

Further, in order to implement the fuse circuit unit, an upper portion of the fuse circuit unit should be empty. Therefore, it is difficult to integrate elements in a laminate shape. This also causes the reduction of the area margin of the semiconductor integrated circuit. In addition, although a few fuse circuit units among many fuse circuit units are actually used by artificial control, according to the related art, one fuse circuit unit is inefficiently prepared for one test signal.

SUMMARY OF THE INVENTION

An embodiment of the present invention provides a test signal generating apparatus for a semiconductor integrated circuit that can improve an area margin and area use efficiency.

Another embodiment of the present invention provides a test signal generating method for a semiconductor integrated circuit.

According to an embodiment of the present invention, there is provided a test signal generating apparatus for a semiconductor integrated circuit, comprising: a fuse control unit that generates a plurality of fuse enable signals in response to a clock and a power-up signal; and a plurality of test mode fuses that individually output test mode fuse signals so as to generate test signals in response to the fuse enable signals after a test mode is completed.

According to another embodiment of the present invention, there is provided a test signal generating apparatus for a semiconductor integrated circuit, comprising: a command decoder that generates multi-bit test mode signals in response to a command, an address, and a clock; a fuse control unit that generates a plurality of fuse enable signals in response to the clock and a power-up signal; a plurality of test mode fuses that output test mode fuse signals in response to the corresponding fuse enable signals; a test mode decoder that decodes the test mode signals and the plurality of test mode fuse signals to generate a plurality of decoding signals and a plurality of fuse decoding signals; a plurality of latch units that latch the corresponding fuse decoding signals to generate latch signals in response to the power-up signal; and a plurality of signal combining units that combine the decoding signals and the latch signals to output test signals.

According to still another of the present invention, there is provided a test signal generating method for a semiconductor integrated circuit, comprising: generating a plurality of fuse enable signals in response to a clock and a power-up signal; outputting a plurality of test mode fuse signals in response to the plurality of fuse enable signals after a test is completed; decoding the plurality of test mode fuse signals and generating a plurality of fuse decoding signals; latching the plurality of fuse decoding signals under the control of the power-up signal and generating a plurality of latch signals; and generating a plurality of test signals from the plurality of latch signals.

DESCRIPTION OF EXEMPLARY EMBODIMENT

Hereinafter, an exemplary embodiment of the present invention will be described in detail with reference to the accompanying drawings.

Figure 1:
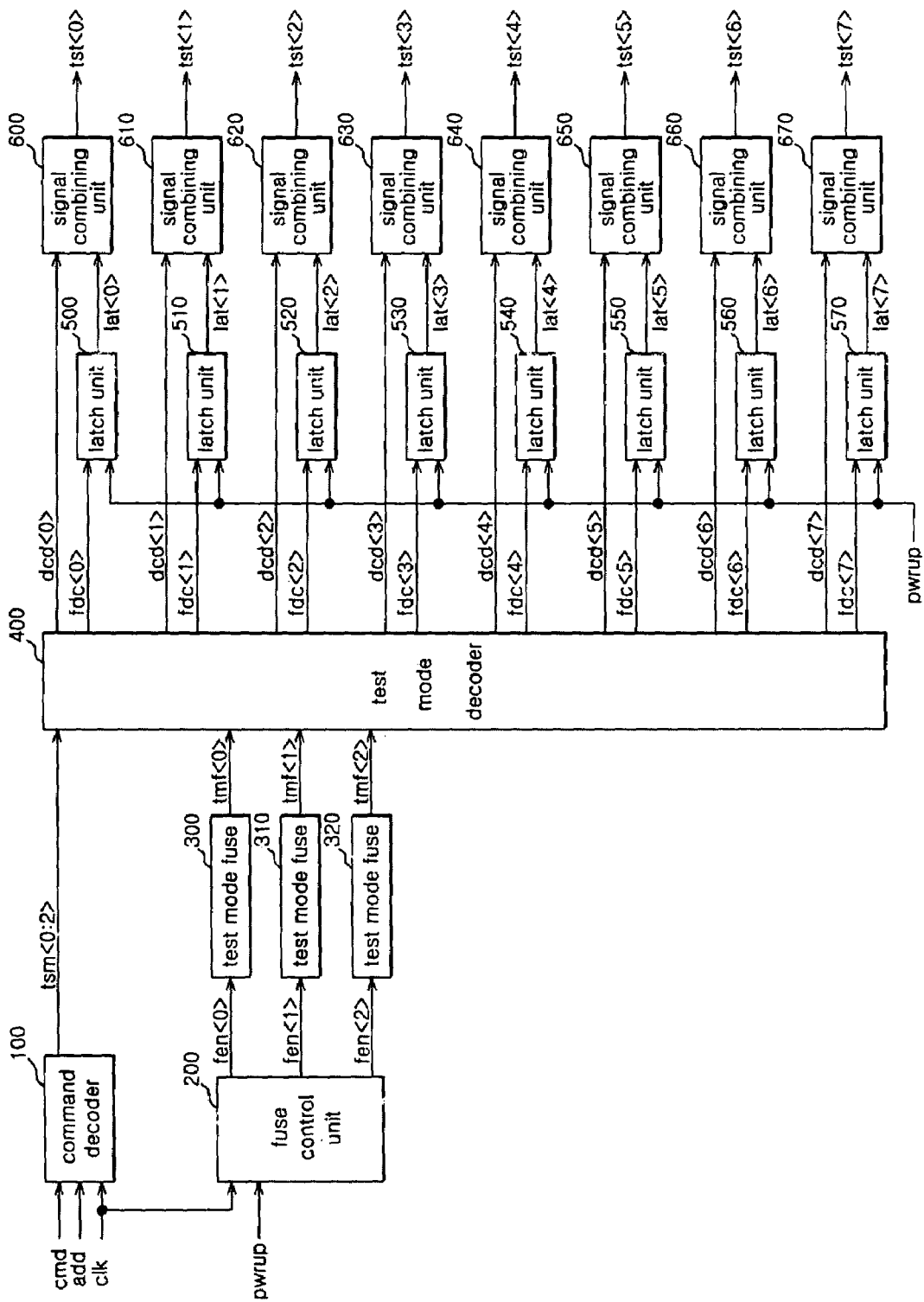
FIG. 1 is a block diagram showing the structure of a test signal generating apparatus for a semiconductor integrated circuit according to an embodiment of the present invention.

Referring to FIG. 1, a test signal generating apparatus includes a command decoder 100, a fuse control unit 200, test mode fuses 300 to 320, a test mode decoder 400, latch units 500 to 570, and signal combining units 600 to 670.

The command decoder 100 generates multi-bit test mode signals, for example, three-bit test mode signals tsm<0:2> in response to a command cmd, an address add, and a clock clk. In a test mode, the command decoder 100 receives the command cmd, the address add, and the clock clk to generate a power-up signal pwrup and the test mode signals tsm<0:2>. The power-up signal pwrup is used to start the operation of the semiconductor integrated circuit. Further, each of the test mode signals tsm<0:2> may have a predetermined level and each combination of the levels of the test mode signals tsm<0:2> (for example, LLL, LLH, or LHH) may represent information of a specified test mode.

The fuse control unit 200 generates three fuse enable signals fen<0:2> in response to the clock clk and the power-up signal pwrup.

The test mode fuses 300 to 320 output test mode fuse signals tmf<i> in response to the fuse enable signals fen<i>. For example, since the number of fuse enable signals fen<i> is three, three test mode fuse signals tmf<i> are output. In the test operation, the three test mode fuses 300 to 320 all are not artificially controlled. Accordingly, all the three test mode fuse signals tmf<0:2> output from the three test mode fuses 300 to 320 have low-level potentials.

The test mode decoder 400 decodes the test mode signals tsm<0:2> and the three test mode fuse signals tmf<0:2>, to generate eight decoding signals dcd<0:7>.

When the power-up signal pwrup is input, each of the latch units 500 to 570 correspondingly latches the corresponding fuse decoding signals fdc<i> to generate latch signals lat<i>. Here, since eight decoding signals dcd<0:7> are generated, eight latch signals lat<i> are generated.

Each of the signal combining units 600 to 670 combines the corresponding decoding signal dcd<i> and the corresponding latch signal lat<i> to output a test signal tst<i>. In this embodiment, eight signal combining units 600 to 670 are provided. If any one of two input signals of the signal combining unit 600 to 670 is at a high level, each of the signal combining units 600 to 670 outputs the test signal tst<i> at a high level. As a result, only when the decoding signal dcd<i> at a high level is input, each of the signal combining units 600 to 670 outputs the test signal tst<i> that is enabled to a high level. Thereafter, the enabled test signal tst<i> is used to change the operation in a predetermined area.

Meanwhile, when the test is completed, the test mode signals tsm<0:2> change to the low level. However, at this time, if the test signals tst<i> need to be continuously enabled, the test mode fuse signals tmf<0:2> need to be generated through artificial control of the three test mode fuses 300 to 320. In this case, the test mode decoder 400 decodes the three test mode fuse signals tmf<0:2> to generate the eight fuse decoding signals fdc<0:7>. Thereafter, the eight latch units 500 to 570 correspondingly latch the eight fuse decoding signals fdc<0:7> to generate the eight latch signals lat<0:7> under the control of the power-up signal pwrup. Further, each of the eight signal combining units 600 to 670 generates the test signal tst<i> based on the corresponding input latch signal lat<i>.

In this embodiment, instead of fuse circuit units corresponding to the number of signal combining units 600 to 670, three test mode fuses 300 to 320 are only provided to generate signals corresponding to the three-bit test mode signals tsm<0:2> input to the test mode decoder 400. Therefore, the number of fuse circuit units can be reduced, and thus an area margin can be increased.

Figure 2:
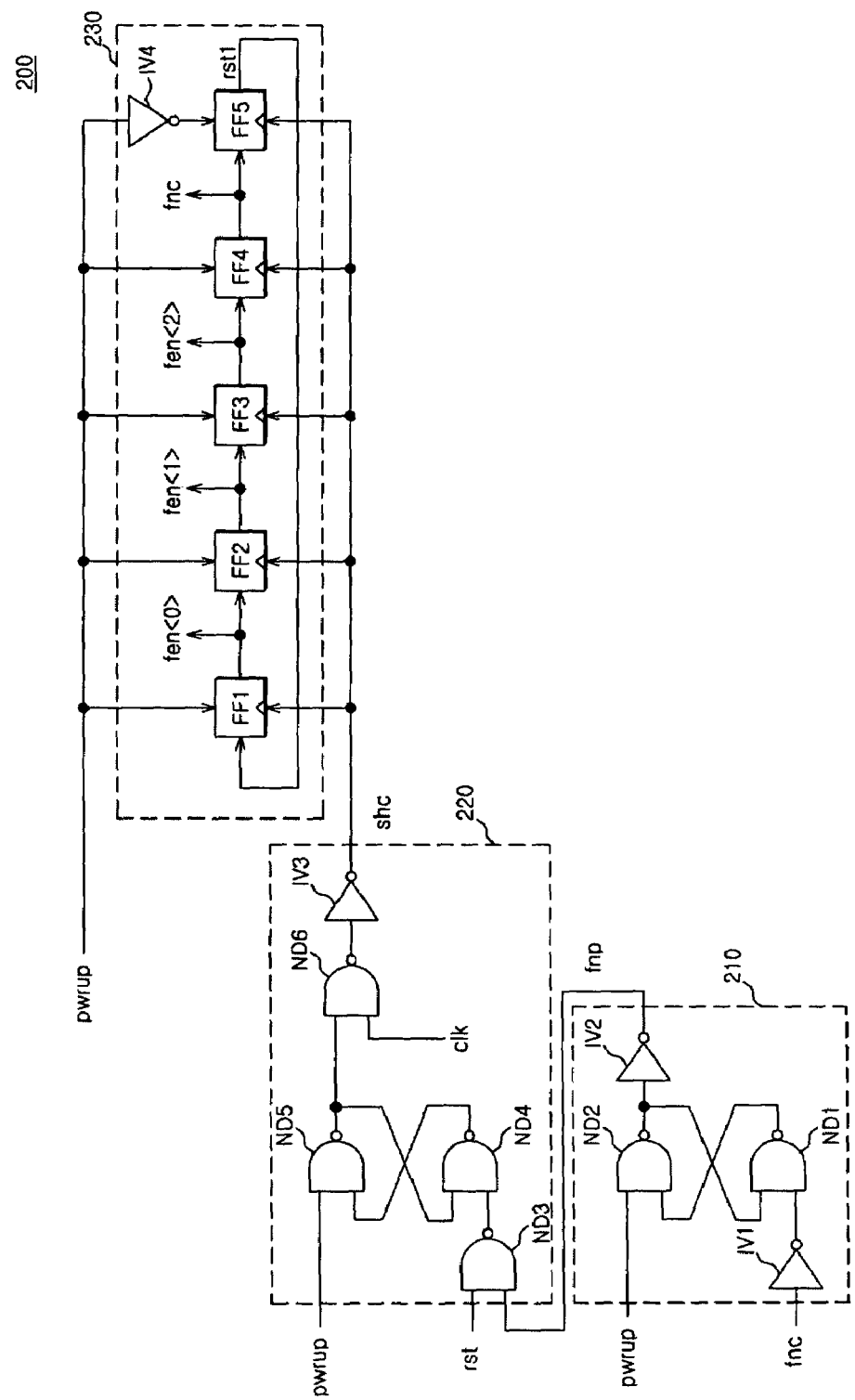
FIG. 2 is a detailed circuit diagram showing a fuse control unit shown in FIG. 1.

Next, the fuse control unit 200 will be described in detail. As shown in FIG. 2, the fuse control unit 200 may include a completion control unit 210, a shift control unit 220, and a signal generation unit 230.

The completion control unit 210 generates a completion instruction signal fnp in response to a completion control signal fnc and the power-up signal pwrup. The completion control unit 210 includes a first inverter IV1 that receives the completion control signal fnc, first and second NAND gates ND1 and ND2 that form a latch for latching an output signal of the first inverter IV1 and the power-up signal pwrup, and a second inverter IV2 that inverts an output signal of the second NAND gate ND2 to output the completion instruction signal fnp.

The shift control unit 220 generates a shift control signal shc in response to the completion instruction signal fnp, the power-up signal pwrup, a reset signal rst, and the clock clk. The shift control unit 220 includes a third NAND gate ND3 that receives the completion instruction signal fnp and the reset signal rst, fourth and fifth NAND gates ND4 and ND5 that form a latch for latching an output signal of the third NAND gate ND3 and the power-up signal pwrup, a sixth NAND gate ND6 that receives an output signal of the fifth NAND gate ND5 and the clock clk, and a third inverter IV3 that inverts an output signal of the sixth NAND gate ND6 to output the shift control signal shc.

The signal generation unit 230 generates the three fuse enable signals fen<0:2>, the completion control signal fnc, and an initial fuse enable signal rst 1 in response to the power-up signal pwrup and the shift control signal shc.

The signal generation unit 230 may include first to fifth flip-flops FF1 to FF5. The first flip-flop FF1 includes a reset terminal to which the power-up signal pwrup is input. The first flip-flop FF1 receives the initial fuse enable signal rst 1 and the shift control signal shc as a clock, to output the fuse enable signal fen<0>. The second flip-flop FF2 has a reset terminal to which the power-up signal pwrup is input. The second flip-flop FF2 receives the fuse enable signal fen<0> and the shift control signal shc as a clock, to output the fuse enable signal fen<1>. The third flip-flop FF3 has a reset terminal to which the power-up signal pwrup is input. The third flip-flop FF3 receives the fuse enable signal fen<1> and the shift control signal shc as a clock, to output the fuse enable signal fen<2>. The fourth flip-flop FF4 has a reset terminal to which the power-up signal pwrup is input. The fourth flip-flop FF4 receives the fuse enable signal fen<2> and the shift control signal shc as a clock, to output the completion control signal fnc. Meanwhile, the fifth flip-flop FF5 has a reset terminal to which an inverted power-up signal pwrup is input through the fourth inverter IV4. The fifth flip-flop FF5 receives the completion control signal fnc and the shift control signal shc as a clock, to output the initial fuse enable signal rst 1 on the basis of the shift control signal shc.

At the beginning of the operation of the semiconductor integrated circuit, before the power-up signal pwrup is enabled, the completion instruction signal fnp that is output from the completion control unit 210 is disabled to the low level. Since the clock clk is not input, the shift control signal shc that is output from the shift control unit 220 is disabled. Since a signal at a low level is input to the reset terminal of each of the first to fourth flip-flops FF1 to FF4 of the signal generation unit 230, the three fuse enable signals fen<0:2> and the completion control signal fnc become the low level. However, since a signal at a high level is input to the reset terminal of the fifth flip-flop FF5 by the fourth inverter IV4, the initial fuse enable signal rst 1 is enabled to the high level.

Figure 3:
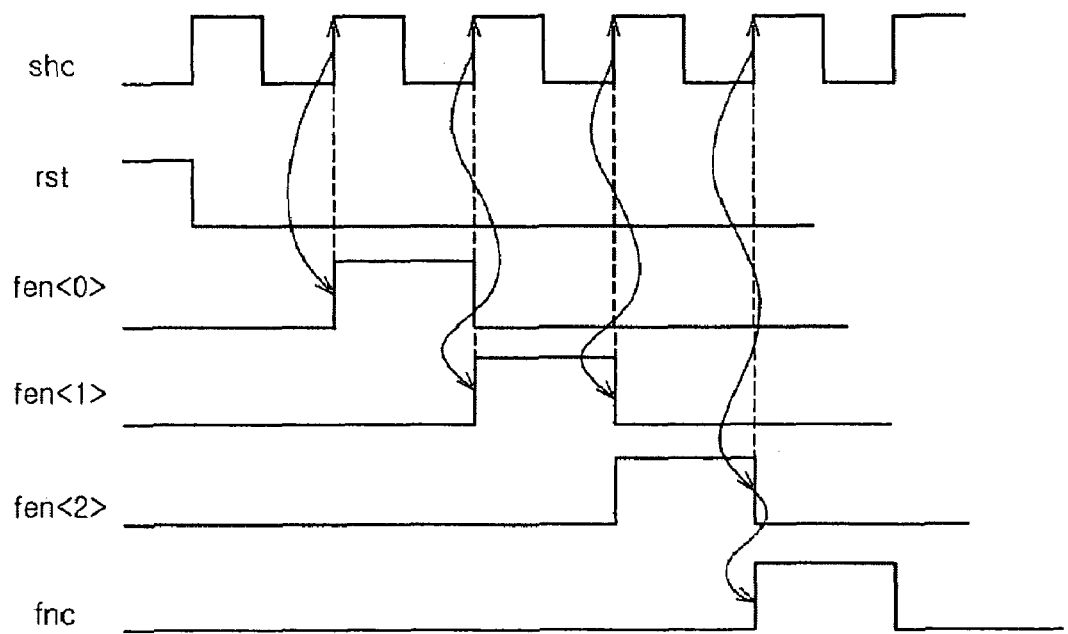
FIG. 3 is a timing diagram illustrating the operation of the fuse control unit according to an embodiment of the present invention.

Thereafter, when the power-up signal pwrup is enabled and the clock clk is input, the completion instruction signal fnp is kept at the low level and the shift control signal shc functions as the clock clk. Each of the first to fifth flip-flops FF1 to FF5 of the signal generation unit 230 transfers the signal output from the previous flip-flop to the next flip-flop at every rising time of the shift control signal shc. As shown in FIG. 3, the initial fuse enable signal rst 1 changes to the low level at a first rising time of the shift control signal shc. Thereafter, at every rising time of the shift control signal shc, the fuse enable signal fen<0>, the fuse enable signal fen<1>, the fuse enable signal fen<2>, the completion control signal fnc, and the initial fuse enable signal rst 1 are sequentially enabled. That is, the fuse enable signal fen<0>, the fuse enable signal fen<1>, the fuse enable signal fen<2>, the completion control signal fnc, and the initial fuse enable signal rst 1 are sequentially enabled to the high level. At this time, the enable time of the fuse enable signal fen<0>, the fuse enable signal fen<1>, the fuse enable signal fen<2>, the completion control signal fnc, and the initial fuse enable signal rst 1 are continued for one cycle of the shift control signal shc.

When the completion control signal fnc is enabled, the completion control unit 210 outputs the completion instruction signal fnp having the high level. Thereafter, the shift control unit 220 disables the shift control signal shc according to the completion instruction signal fnp. At this time, the sequential enable operation of the fuse enable signal fen<0>, the fuse enable signal fen<1>, the fuse enable signal fen<2>, the completion control signal fnc, and the initial fuse enable signal rst 1 is performed once at the beginning of the operation of the semiconductor integrated circuit.

When the fuse enable signal fen<0>, the fuse enable signal fen<1>, and the fuse enable signal fen<2> are sequentially enabled from the fuse control unit 200, the three test mode fuses 300 to 320 are sequentially activated one by one. Accordingly, the test mode fuse signals tmf<0:2> are sequentially output.

When the test of the semiconductor integrated circuit is completed, the test mode decoder 400 decodes the test mode fuse signals tmf<0:2> to generate the eight fuse decoding signals fdc<0:7>.

Figure 4:
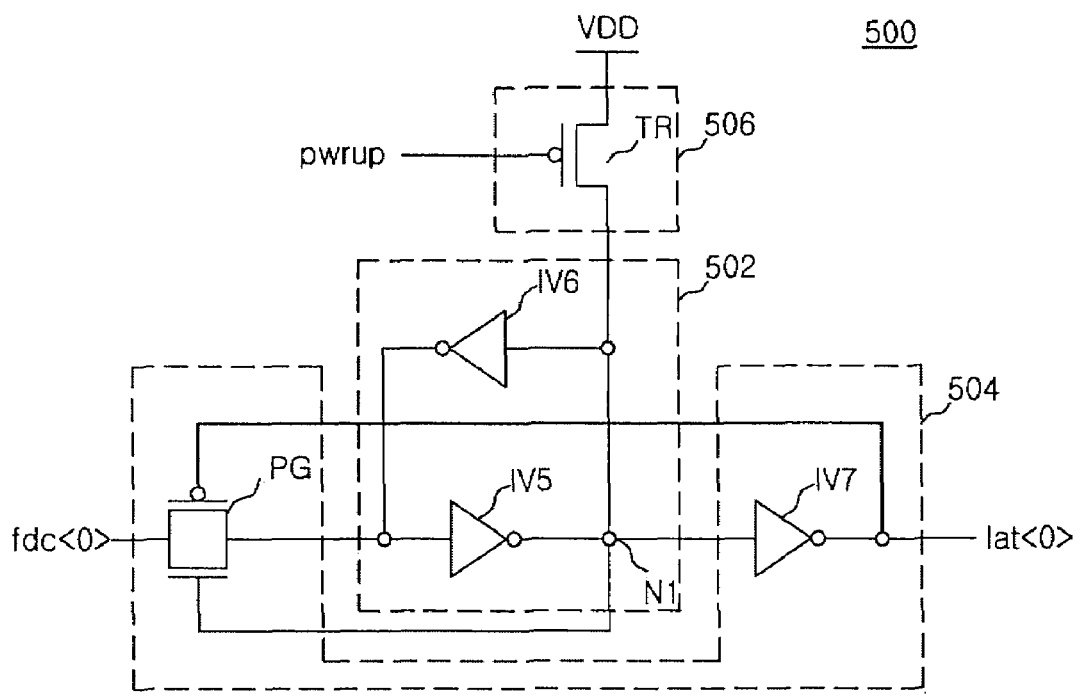
FIG. 4 is a detailed circuit diagram showing a latch unit shown in FIG. 1.

FIG. 4 is a detailed circuit diagram showing a latch unit shown in FIG. 1. In this embodiment, since the eight latch units have the same structure, only the first latch unit 500 will be described.

The latch unit 500 includes a latch section 502, an input control section 504, and a power supply control section 506. The latch section 502 receives and latches the fuse decoding signal fdc<0>. The latch section 502 includes fifth and sixth inverters IV5 and IV6 so as to latch the fuse decoding signal fdc<0> transferred through the input control section 504. The input control section 504 includes a seventh inverter IV7 that inverts a signal output from the latch section 502 to output the latch signal lat<0> and a pass gate PG that passes the fuse decoding signal fdc<0> under the control of the latch signal lat<0>. The power supply control section 506 controls power to be supplied to the latch section 502 and the input control section 504 according to the power-up signal pwrup. The power supply control section 506 includes a transistor TR that supplies an external power supply VDD to the latch section 502 and the input control section 504 when the power-up signal pwrup is disabled.

At the beginning of the operation of the semiconductor integrated circuit, when the power-up signal pwrup is disabled, the transistor TR of the power control section 506 is turned on. Then, the potential of a first node N1, that is, a common node of the latch section 502, the input control section 504, and the power supply control section 506 becomes the high level. Accordingly, the latch signal lat<0> becomes the low level, the pass gate PG is turned on, to input the fuse decoding signal fdc<0>. When the power-up signal pwrup is enabled, the transistor TR is turned off and the pass gate PG is kept in the turned-on state. If the potential of the fuse decoding signal fdc<0> is kept at the low level, the latch section 502 stores the potential of the fuse decoding signal fdc<0> such that the latch signal lat<0> continuously has a potential at a low level. However, if the fuse decoding signal fdc<0> has a potential at a high level, the latch section 502 stores the potential of the fuse decoding signal fdc<0> such that the latch signal lat<0> continuously has a potential at a high level. Therefore, the pass gate PG is turned off.

Through the above-described operation, the values of the eight fuse decoding signals fdc<0:7> are correspondingly stored in the latch units 500 to 570, and the eight latch units 500 to 570 continuously output the eight latch signals lat<0:7> corresponding to the eight fuse decoding signals fdc<0:7>, respectively.

Thereafter, the eight signal combining units 600 to 670 receive the eight latch signals lat<0:7> to continuously output the eight test signals tst<0:7>, respectively. Accordingly, after the test is completed, the operation in an area corresponding to the enabled signal among the eight test signals tst<0:7> can be controlled.

According to this embodiment of the invention, the test signal generating apparatus for a semiconductor integrated circuit includes the fuse control unit that generates signals to operate a small number of test mode fuses. Accordingly, it is possible to reduce the number of fuse circuit units (test mode fuses) that operate when the test signals are continuously generated even if the test of the semiconductor integrated circuit is completed.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A test signal generating apparatus for a semiconductor integrated circuit, comprising:
   a fuse control unit that generates a completion instruction signal for instruction of completion of a test mode in response to a completion control signal and a power-up signal and generates a plurality of fuse enable signals using the completion control signal; and
   a plurality of test mode fuses that individually output test mode fuse signals so as to generate test signals in response to the fuse enable signals after the test mode is completed.

2. The test signal generating apparatus of claim 1, wherein the plurality of test mode fuses are artificially controlled when the test signals are to be continuously generated even if the test mode is completed.

3. The test signal generating apparatus of claim 1, wherein the fuse control unit includes:
   a completion control unit that generates the completion instruction signal in response to the completion control signal and the power-up signal;
   a shift control unit that generates a shift control signal in response to the completion instruction signal, the power-up signal, a reset signal, and a clock; and
   a signal generation unit that generates the plurality of fuse enable signals, the completion control signal, and an initial fuse enable signal in response to the power-up signal and the shift control signal.

4. The test signal generating apparatus of claim 1, further comprising:
   a command decoder that generates multi-bit test mode signals to generate the test signals in the test mode.

5. The test signal generating apparatus of claim 4, further comprising:
   a test mode decoder that decodes the test signals and the test mode fuse signals to output a plurality of fuse decoding signals.

6. The test signal generating apparatus of claim 5, further comprising:
   a plurality of latch units that correspondingly latch the plurality of fuse decoding signals output from the test mode decoder to generate latch signals in response to the power-up signal.

7. The test signal generating apparatus of claim 6, further comprising:
   a plurality of signal combining units that combine the plurality of fuse decoding signals output from the test mode decoder and the latch signals so as to output the test signals.

8. A test signal generating apparatus for a semiconductor integrated circuit, the test signal generating apparatus comprising:
a command decoder that generates multi-bit test mode signals in response to a command, an address, and a clock;
a fuse control unit that generates a plurality of fuse enable signals in response to the clock and a power-up signal;
a plurality of test mode fuses that output test mode fuse signals in response to each of the fuse enable signals;
a test mode decoder that decodes the test mode signals and the plurality of test mode fuse signals to generate a plurality of decoding signals and a plurality of fuse decoding signals;
a plurality of latch units that latch the fuse decoding signals to generate latch signals in response to the power-up signal; and
a plurality of signal combining units that combine the decoding signals and the latch signals to output test signals.

9. The test signal generating apparatus of claim 8, wherein the plurality of test mode fuses are artificially controlled when the test signals are to be continuously generated even if a test is completed.

10. The test signal generating apparatus of claim 8, wherein the fuse control unit includes:
a completion control unit that generates a completion instruction signal in response to a completion control signal and the power-up signal;
a shift control unit that generates a shift control signal in response to the completion instruction signal, the power-up signal, a reset signal, and the clock; and
a signal generation unit that generates the plurality of fuse enable signals, the completion control signal, and an initial fuse enable signal in response to the power-up signal and the shift control signal.

11. The test signal generating apparatus of claim 10, wherein the completion control unit includes:
a first inverter that receives the completion control signal as input and produces an output signal;
first and second NAND gates that form a latch to latch the output signal of the first inverter and the power-up signal, the second NAND gate providing an output signal; and
a second inverter that inverts the output signal of the second NAND gate to output the completion instruction signal.

12. The test signal generating apparatus of claim 10, wherein the shift control unit includes:
a first NAND gate that receives the completion instruction signal and the reset signal as input and provides an output signal;
second and third NAND gates that form a latch to latch the output signal of the first NAND gate and the power-up signal, the third NAND gate providing an output;
a fourth NAND gate that receives the output signal of the third NAND gate and the clock as input and provides an output signal; and
an inverter that inverts the output signal of the fourth NAND gate to output the shift control signal.

13. The test signal generating apparatus of claim 10, wherein the signal generation unit includes a plurality of flip-flops, each of which outputs a signal transferred from a previous flip-flop as any one of the fuse enable signal, the completion control signal, and the initial fuse enable signal under the control of the shift control signal,
a first-stage flip-flop among the plurality of flip-flops receives the initial fuse enable signal, and
a last-stage flip-flop receives the completion control signal to output the initial fuse enable signal.

14. The test signal generating apparatus of claim 8, wherein each of the latch units includes:
a latch section that receives and latches one of the fuse decoding signals to provide a signal output;
an input control section that controls an input of the fuse decoding signal in the latch section on the basis of a potential level of a signal stored in the latch; and
a power supply control section that controls power supply to the latch section and the input control section in response to the power-up signal.

15. The test signal generating apparatus of claim 14, wherein the latch section includes first and second inverters that latch the fuse decoding signal transferred through the input control section.

16. The test signal generating apparatus of claim 14, wherein the input control section includes:
an inverter that inverts the signal output from the latch section and outputs a latch signal; and
a pass gate that passes the fuse decoding signal under the control of the latch signal.

17. The test signal generating apparatus of claim 14, wherein the power control section includes a transistor that supplies an external power supply to the latch section and the input control section when the power-up signal is disabled.

18. A test signal generating method for a semiconductor integrated circuit, comprising:
generating a plurality of fuse enable signals in response to a clock and a power-up signal;
outputting a plurality of test mode fuse signals in response to the plurality of fuse enable signals after a test is completed;
decoding the plurality of test mode fuse signals thereby generating a plurality of fuse decoding signals;
latching the plurality of fuse decoding signals under control of the power-up signal thereby generating a plurality of latch signals; and
generating a plurality of test signals from the plurality of latch signals.

19. The test signal generating method of claim 18, wherein, when the test signal are to be continuously generated even if the test is completed,
the plurality of test mode fuse signals are generated from artificially controlled fuse circuit units, and
the test mode fuse signals are sequentially output in response to the plurality of fuse enable signals that are sequentially enabled.

20. The test signal generating method of claim 18, wherein the generating of the plurality of fuse enable signals includes:
generating a completion control signal and a reset signal in response to the power-up signal and the clock;
generating a completion instruction signal in response to the completion control signal and the power-up signal;
generating a shift control signal in response to the completion instruction signal, the power-up signal, the reset signal, and the clock; and
generating the plurality of fuse enable signals, the completion control signal, and an initial fuse enable signal in response to the power-up signal and the shift control signal.

* * * * *